(12) United States Patent
Kaal

(10) Patent No.: US 7,038,943 B2
(45) Date of Patent: May 2, 2006

(54) MEMORY ARRAY HAVING 2T MEMORY CELLS

(75) Inventor: Victor Kaal, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/515,941

(22) PCT Filed: May 9, 2003

(86) PCT No.: PCT/IB03/01931

§ 371 (c)(1),
(2), (4) Date: Nov. 23, 2004

(87) PCT Pub. No.: WO03/100788

PCT Pub. Date: Dec. 4, 2003

(65) Prior Publication Data

US 2005/0157533 A1 Jul. 21, 2005

(30) Foreign Application Priority Data

May 28, 2002 (EP) .................................. 02077100

(51) Int. Cl.
*G11C 11/34* (2006.01)

(52) U.S. Cl. ........................................ 365/174; 365/63
(58) Field of Classification Search ................ 365/149, 365/185.01, 185.26, 174, 63
See application file for complete search history.

(56) References Cited

U.S. PATENT DOCUMENTS 6,680,864 B1 * 1/2004 Noble .......................... 365/177
6,804,142 B1 * 10/2004 Forbes ........................ 365/149

* cited by examiner

*Primary Examiner*—Tuan T. Nguyen
*Assistant Examiner*—Pho M. Luu

(57) ABSTRACT

The present invention relates to a memory array having a plurality of memory cells. In order to combine the compactness of DRAM with the speed and uncomplicated processing profits of SRAM the present invention proposes a memory array having a plurality of memory cells each comprising:—a storage transistor having a drain coupled to a word-line of said array, a source coupled to a bit-line of said array and a gate, and—a control transistor having a drain coupled to the gate of said storage transistor, a source coupled to said bit-line and a gate coupled to said word-line.

12 Claims, 5 Drawing Sheets

MEMORY ARRAY HAVING 2T MEMORY CELLS

Figure 1:
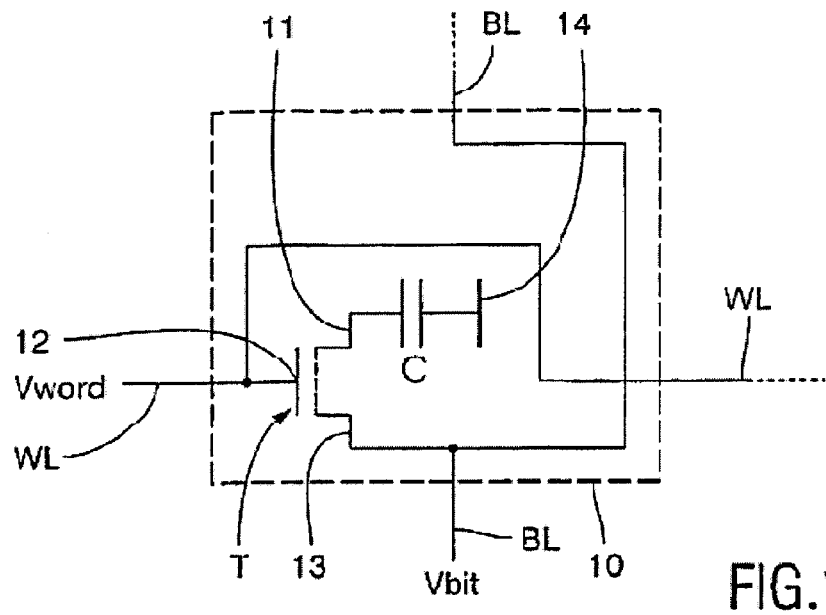

The invention relates to a memory array having a plurality of memory cells.

There are many different memory cells known for use in a semiconductor memory array. A widely known and used type of a DRAM memory cell comprises a single transistor and a capacitor coupled to the drain of said transistor. Because of the parasitic capacitance on a bit-line to which the source of said capacitor is coupled such a memory cell needs a large capacitor for robust operation. Further, since the read-out is destructive a read operation has to be followed by a rewrite operation.

A memory cell having three transistors is known from H. Veendrick, "Deep-Submicron CMOS ICs", Kluwer Academic Publishers, 2$^{nd}$ English edition, 2000, pp. 272. Instead of one word-line such a cell has two word-specific control lines. Since the cell requires 3 transistors, in practice this results in an insufficient silicon area reduction compared to SRAM solutions.

In general, DRAM memory cells enable a compact memory solution. On the other hand, SRAM memory cells do not require any additional mask steps on top of the default process which saves both costs and time-to-market. Further, SRAM is usually faster than DRAM.

It is therefore an object of the present invention to provide a memory array having a plurality of memory cells which approaches the compactness of DRAM and combines this with the speed and uncomplicated processing profits of SRAM.

This object is achieved according to the present invention by a memory array as claimed in claim 1, according to which each memory cell comprises:
- a storage transistor having a drain coupled to a word-line of said array, a source coupled to a bit-line of said array and a gate, and
- a control transistor having a drain coupled to the gate of said storage transistor, a source coupled to said bit-line and a gate coupled to said word-line.

With the memory cells of the memory array according to the present invention the load is stored at the gate of the storage transistor. As function of the momentary capacitance at the gate the load results in a storage voltage. The storage transistor can be enabled to pull a current in a read-mode. The control transistor is used to enable or disable the programming of the storage voltage. The present invention thus provides a solution which combines both the advantages of a 1T DRAM cell and a 3T cell as described above, i.e. it provides a very small cell having a non-destructive read-out. Further, the read-out is potentially faster than a conventional DRAM cell as the memory cell according to the present invention has a built-in amplification and since the restore cycle can be omitted.

Preferred advantageous embodiments of the present invention are defined in the dependent claims. According to one aspect of the invention means are provided for applying a word-line voltage to said word-line and/or a bit-line voltage to said bit-line, and further control means for controlling said word-line voltage so as to define three static states of a memory cell. Such static states are, as defined further in claim 3, a pull state, a store state and a write state. The word-line is used to control read, write and store operation modes of the memory cell, while a bit-line voltage is used to determine the storage voltage as a result of a write operation.

The 2T memory cell used in the memory array according to the present invention can be in such different static states. The basic operations needed for data-manipulation, like a write operation and a read-operation, require transitions between such static states. Those operations are referred to as "dynamic operations" and are controlled by said control means by controlling the word-line voltage. Preferred embodiments defining control means for controlling such dynamic operations are defined in claims 4 and 5.

According to another preferred embodiment low-leakage MOS transistors are used as storage transistor and control transistor of said memory cells. In still another preferred embodiment, NMOST or PMOST memory cells are used.

According to another aspect an extra capacitance can be provided on the gate of the storage transistor against ground. At the expense of silicon area improved refresh times can thus be implemented.

Figure 2:
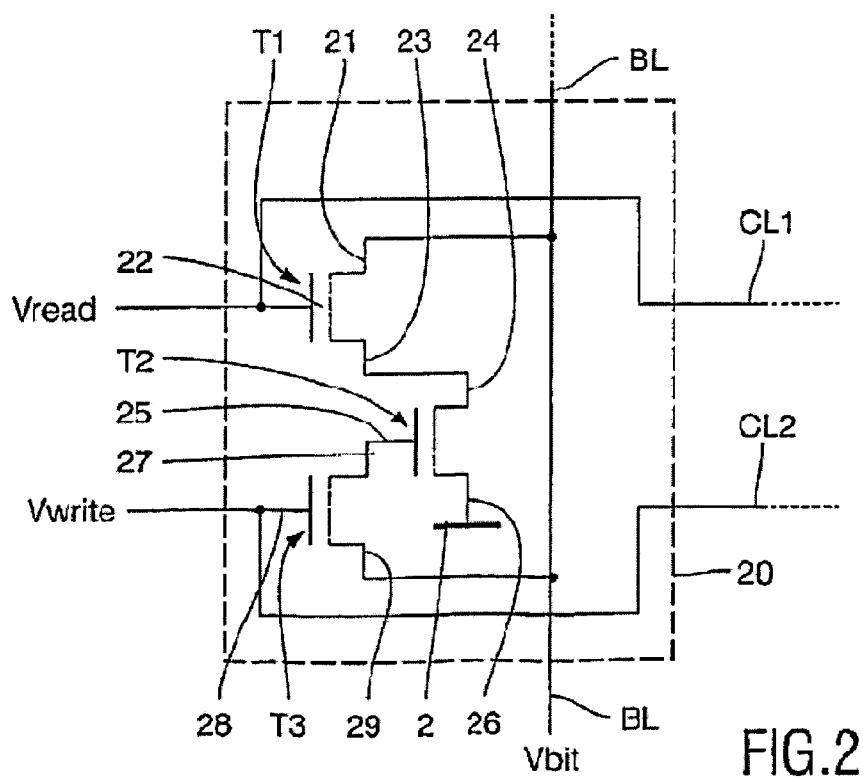
Figure 3:
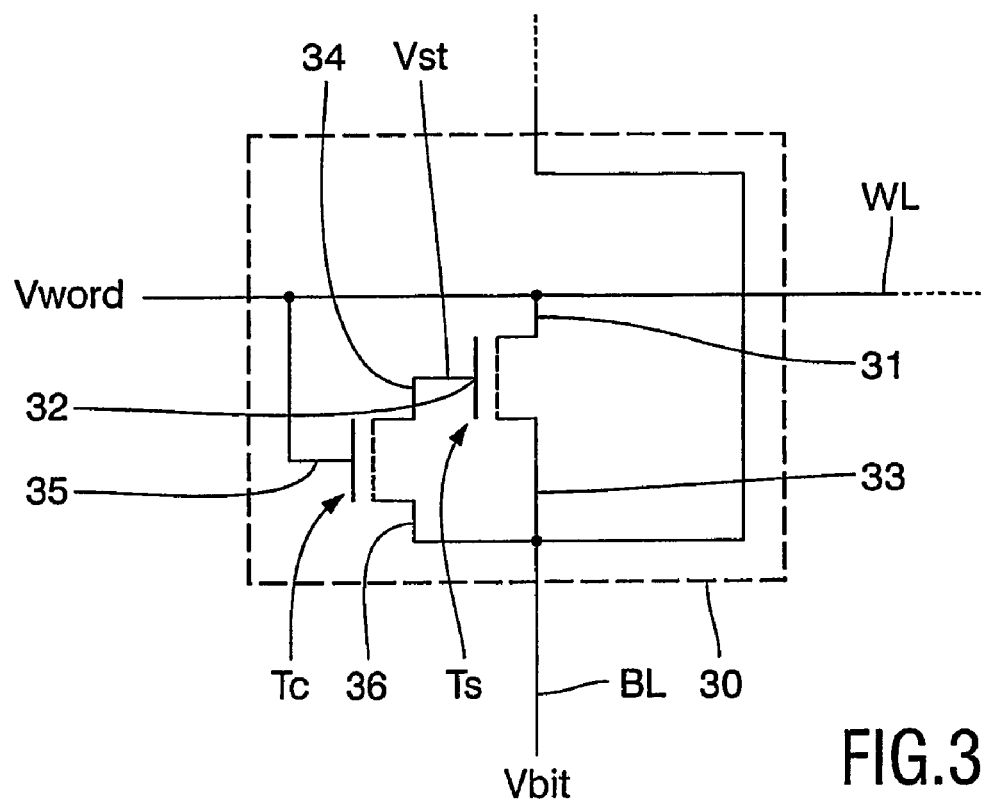
Figure 4:
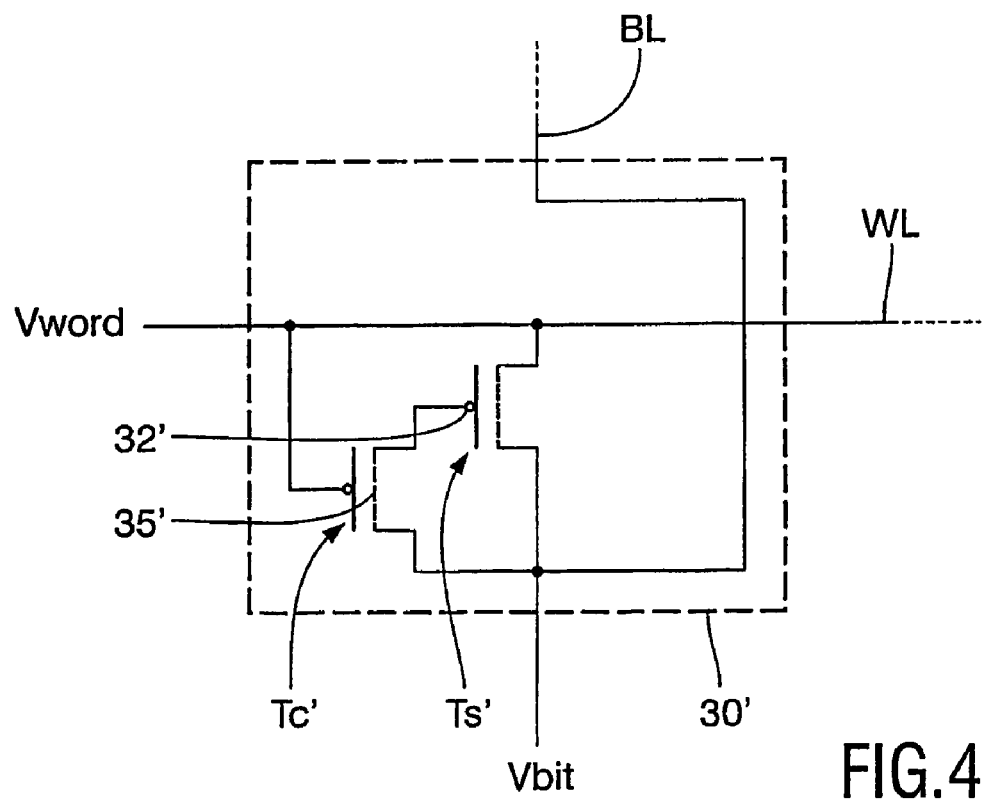
Figure 5:
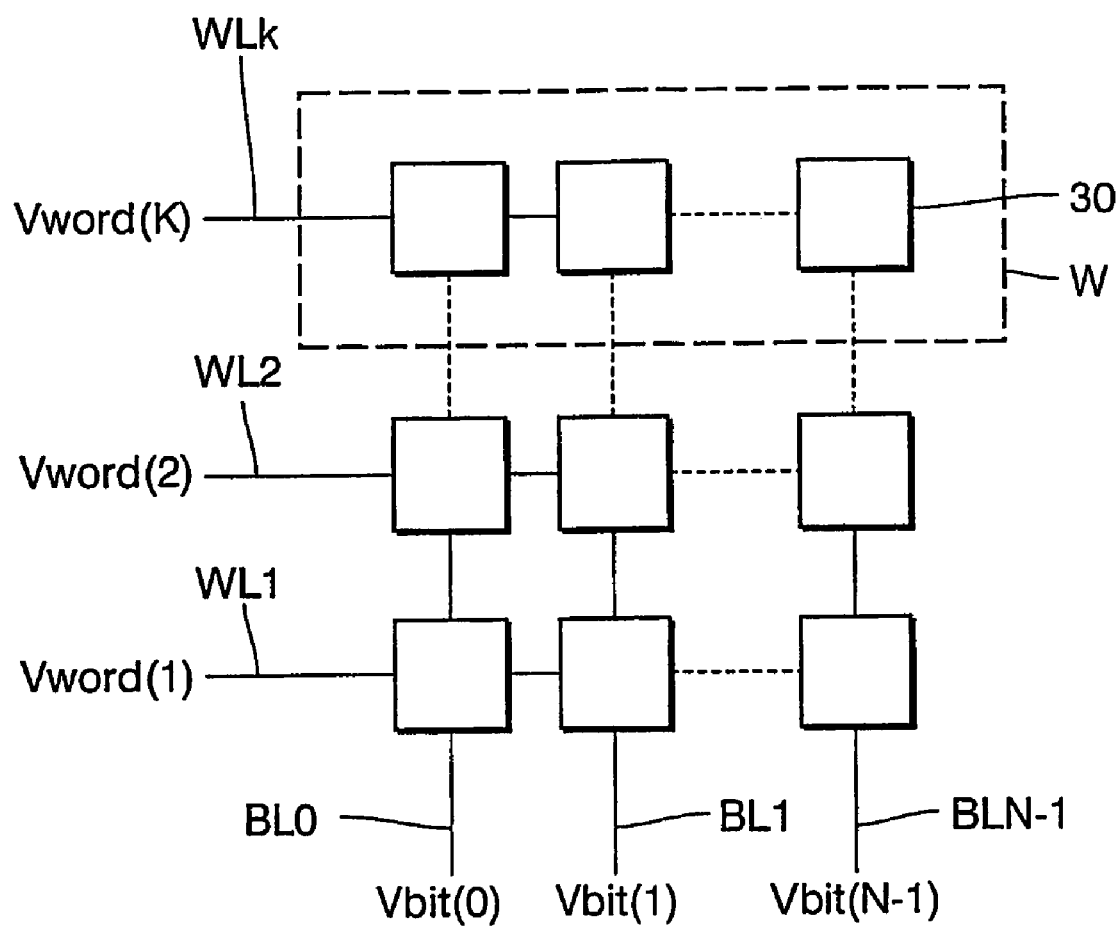
Figure 6:
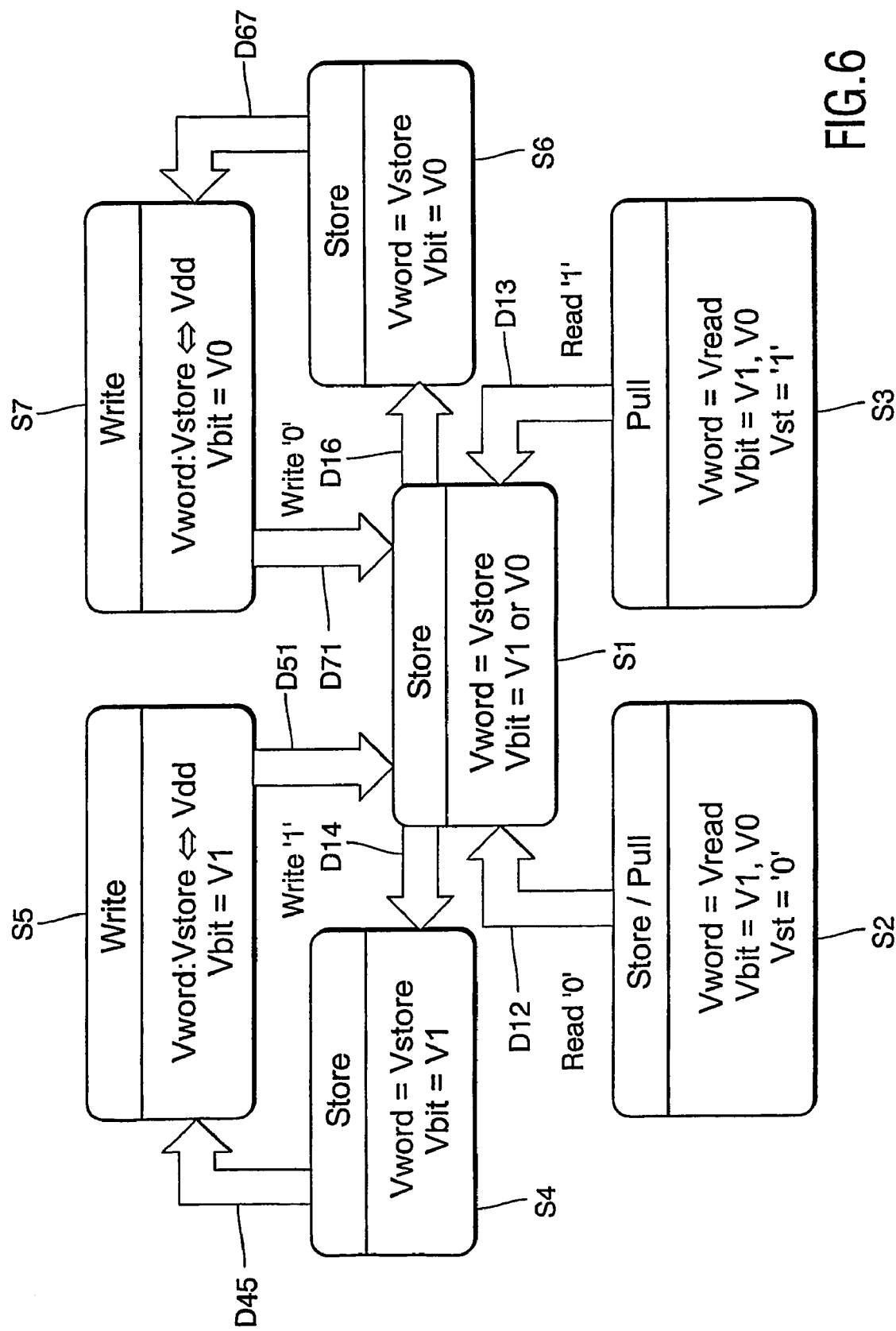
Figure 7:
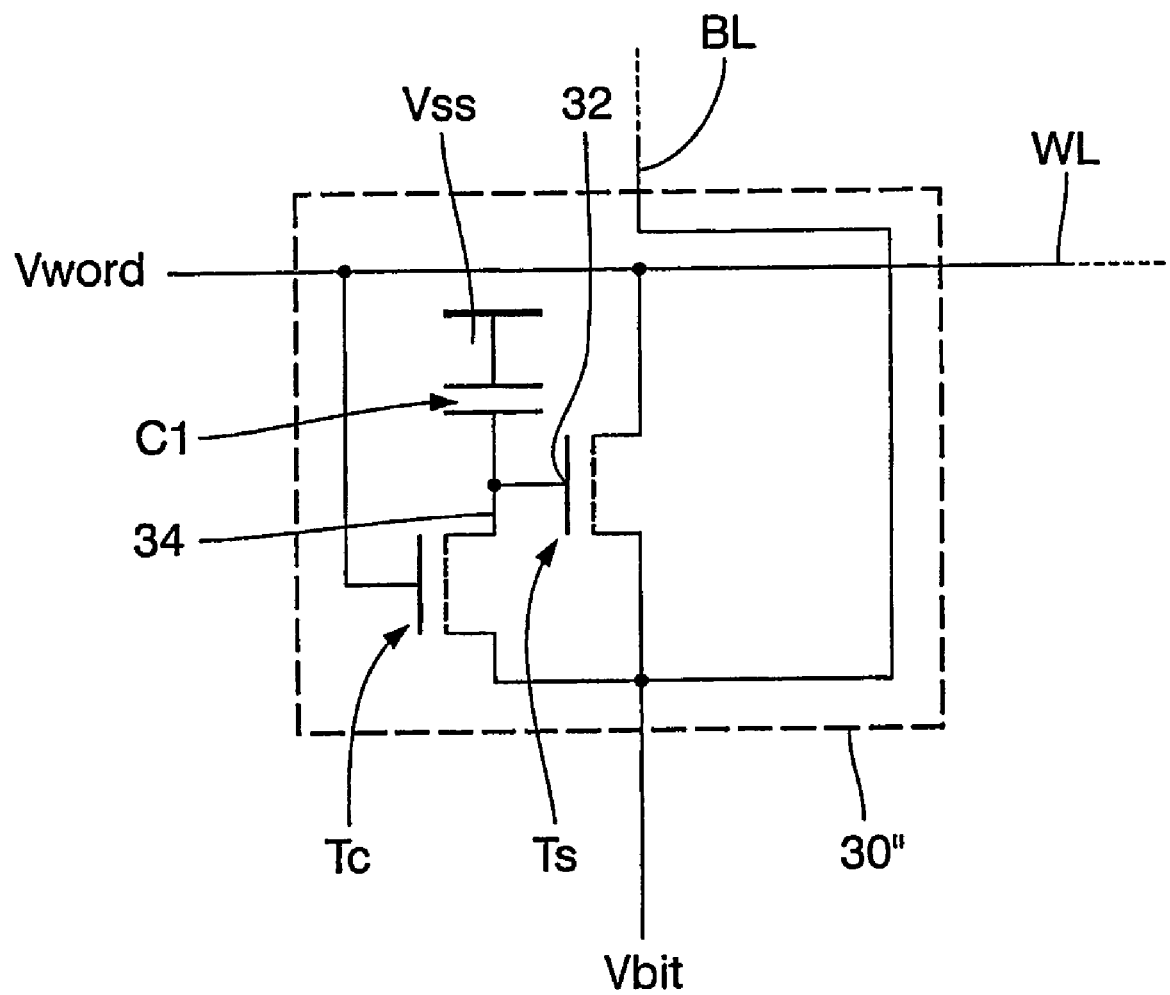

The invention will now be explained in more detail with reference to the drawings, in which FIG. 1 shows the layout of a known 1T memory cell, FIG. 2 shows the layout of a known 3T memory cell, FIG. 3 shows the NMOST layout of a memory cell according to the present invention, FIG. 4 shows the PMOST layout of a memory cell according to the present invention, FIG. 5 shows a general layout of a memory array, FIG. 6 shows a diagram illustrating the different static states and dynamic operations according to the present invention, and FIG. 7 shows another embodiment of a memory cell according to the present invention.

FIG. 1 shows the layout of a conventional 1T (one-transistor) DRAM memory cell 10. Said memory cell 10 comprises a single transistor T having a drain 11, a gate 12 and a source 13. Further, said memory cell 10 comprises a capacitor C the first electrode of which is coupled to the drain 11 and the second electrode of which is coupled to an input terminal 14 for supplying an input voltage such as a ground voltage or a supply voltage (particularly a supply voltage divided by a factor of 2). The gate 12 is connected to a word-line WL for applying a word-line voltage Vword; the source 13 is connected to a bit-line BL for applying a bit-line voltage Vbit. A storage voltage Vst is provided at drain 11.

Such a memory cell 10 needs a large capacitor C for robust operation, because of the parasitic capacitance on the bit-line BL during a read operation. The active read-out of the 2T cell results in the effect of an amplified capacitor, thus enabling a faster read operation. Further, additional mask steps are required to manufacture area-efficient trench capacitors. A hierarchical breakdown of sense-amplifiers is required for robust read-out, adding up to the average storage cell area. A further disadvantage of this memory cell is that a read operation has to be followed by a rewrite, as the read-out is destructive.

The layout of a known 3T (threee-transistor) memory cell 20 is shown in FIG. 2. This memory cell 20 comprises three transistors T1, T2, T3. The drain 21 of the first transistor T1 and the source 29 of the third transistor T3 are connected to a bit-line BL to which a bit-line voltage Vbit can be applied. The gate 22 of the first transistor T1 is coupled to a first control-line CL1 to which a first control voltage Vread can be applied. The source 23 of the first transistor T1 is connected to the drain 24 of the second transistor T2. The gate 25 of the second transistor T2 is connected to the drain 27 of the third transistor T3. The source 26 of the second transistor T2 is connected to a voltage input terminal 20 for supply of an input voltage. The gate of the third transistor T3 is connected to a second control line CL2 to which a second control voltage Vwrite can be applied. A storage voltage Vst is provided at gate 25.

Thus, as shown in FIG. 2, instead of one word-line as in the 1T memory cell shown in FIG. 1, the cell 20 has two word-specific control lines, i.e. a read and a write line that are used to enable read and write operation. Since in total three transistors are required, in practice this results in insufficient silicon area reduction compared to SRAM solutions.

FIG. 3 shows the layout of a first embodiment of a 2T (two-transistor) memory cell 30 according to the present invention. Shown is an NMOST layout. The memory cell 30 comprises two transistors, a storage transistor Ts and a control transistor Tc. The drain 31 of the storage transistor Ts is coupled to a word-line WL. The gate 32 of the storage transistor Ts is coupled to the drain 34 of the control transistor Tc. The source 33 of the storage transistor Ts is coupled to a bit-line BL. The gate 35 of the control transistor Tc is also coupled to the wordline WL. The source 36 of the control transistor Tc is coupled to the bitline BL.

The load in this memory cell 30 is stored at the gate node 32 of the storage transistor Ts. As function of the momentary capacitance at the gate node 32 the load results in a storage voltage Vst at said gate node 32. The storage transistor Ts can be enabled to pull a current in read-mode.

The control transistor Tc is provided for enabling or disabling the programming of said storage voltage Vst. A word-line voltage Vword is applied on the word-line WL. The word-line WL is thus used to control the read, write and store operation modes of the memory cell 30. Further, a bit-line voltage Vbit is applied on the bit-line BL. This bit-line voltage determines the storage voltage Vst as a result of a write operation as will be explained below.

Another embodiment of a memory cell 30' according to the present invention is shown in FIG. 4. Therein a PMOST version is shown. However, the general layout and the general function is identical to the memory cell 30 shown in FIG. 3.

The layout of a memory array comprising a plurality of preferably indentical memory cells arranged in rows and columns is shown in FIG. 5. As shown, there are K rows with associated word-lines WL1, WL2, . . . , WLK. Each row comprises N memory cells connected to the word-line. An individual word-line voltage Vword can be applied to the word-line. The N memory cells of one row form one word W. Further, K columns of memory cells are formed, the memory cells of each column connected to a specific bit-line BL of N bit-lines BL0, BL1, . . . , BLN-1. To each of said bit-lines an individual bit-line voltage Vbit can be applied.

The operating principle will be explained using the embodiment of the NMOST variant of the 2T memory cell as shown in FIG. 3 and as it is used for a digital application. However, it should be noted, that the memory cell according to the present invention is capable of storing a load that is within a particular range. This enables digital, multi-valued or analogue storage, or any combination of these storage principles.

The 2T memory cell according to the invention can be in several states that need a distinct description. These are referred to as the "static states". The basic operations needed for data-manipulation, like "write 1" and "read", require transitions between static states. These operations are referred to as "dynamic operations". There are three static states that can be defined with the word-line voltage Vword and the storage voltage Vst. These states are:

a) pull-state: Vss<Vword<Vst−Vt (Vss=ground voltage; Vt=threshold voltage). In this state a current is pulled from the bit-line through the storage transistor Ts into the word-line. The control transistor Tc is "off".

b) store-state: Vst−Vt<Vword<Vst+Vt. Both the storage transistor Ts and the control transistor Tc are "off"; the storage voltage Vst remains.

c) write-state: Vst+Vt<Vword<Vdd. The control transistor Tc is "open" and the storage voltage Vst equals the bit-line voltage Vbit.

FIG. 6 shows the transitions between the static states that are required to carry out the dynamic operations:

1. Read-operation: Initially, the memory cell is in the store-state S1. By decreasing the word-line voltage Vword from the store level Vstore to the read level Vread the memory cell can change into the pull-state S3 or store/pull state S2. For instance, Vread can equal Vss. Whether the change of static state occurs, depends on the storage voltage value Vst. After comparison of the current through the bit-line with a reference current, the word-line voltage Vword sweeps back to Vstore and the memory cell changes back into the store state S1.

a) read "0" (transition D12): the memory cell remains in the store-state and no current flows through the bit-line. This is interpreted as a digital "0". It is also possible to move the memory cell into the pull-state to pull a current smaller than the reference current.

b) read "1" (transition D13): the memory cell has transferred to the pull-state S3. A current that is larger than the reference current is pulled from the bit-line. This is interpreted as a digital "1".

2. Write operation: initially the memory cell is in the store-state S1. By increasing the word-line voltage Vword from the store level Vstore (state S4) to the write level Vwrite, the memory cell can change to the write state S5 (transition D45). For instance, Vwrite can equal Vdd. The storage voltage Vst equals Vbit. After that, the word-line voltage Vword sweeps back to the Vstore value (transition D51) and the memory cell changes back into the store state S1. In principle, the storage voltage Vst becomes the minimum of Vbit or the difference of Vdd and Vt, i.e. Vst becomes min (Vbit, Vdd−Vt).

a) write "1" (transitions D14, D45, D51): offer Vbit=V1, V1 equals e.g. Vdd.

b) write "0" (transitions D16, D67, D71): offer Vbit=V0 (states S6, S7), V0 large enough to prevent leakage through the control transistor Tc in non-selected words.

3. Refresh operation: this operation is the sequence of a read and a write (rewrite) operation.

FIG. 7 shows another embodiment of a 2T memory cell 30" according to the present invention which is substantially identical to the layout of the memory cell 30 shown in FIG. 3. The only difference is that an extra capacitance C1 is implemented on the gate 32 of the storage transistor Ts, the other electrode of the capacitance C1 being connected to the ground voltage Vss, i.e. between Vst and Vss. This capacitance C1 is used to improve the refresh times.

Compared to the known solutions the 2T memory cell according to the present invention based on DRAM has a bit-density comparable to conventional DRAM solutions. The memory cell according to the present invention can be produced with a default process flow. A conventional DRAM requires an overhead of additional mask steps. The 2T memory cell according to the present invention based on DRAM enables significant savings on the processing costs and improved time-to-market. Further, the 2T memory cell according to the present invention based on DRAM can be combined with flash memory. Conventionally, flash memory processing could not be combined with the process steps for conventional DRAM memory. Usually SRAM memory is used by lack of an alternative solution. The 2T memory cell according to the present invention is a cheap alternative for SRAM in such combined flash memory ICs.

The 2T memory cell based on DRAM according to the present invention implies two major benefits. First, the read-out is non-destructive. Second, the built-in amplification relaxes the requirements for the peripheral circuitry for the sensing during read-out. This saves silicon area occupied by sense-amplifiers.

The invention is generally based on the insight to use (a part of) the span of the gate-voltage where MOS transistor is "off" to control other processing. According to the invention the lower part of the "off" region of the gate voltage of an NMOS transistor has been used to induce the floating of a current in case a "1" was programmed in the 2T memory cell according to the invention.

The invention claimed is:

1. A memory array having a plurality of memory cells each comprising:
    a storage transistor having a drain coupled to a word-line of said array, a source coupled to a bit-line of said array and a gate, and
    a control transistor having a drain coupled to the gate of said storage transistor, a source coupled to said bit-line and a gate coupled to said word-line.

2. The memory array of claim 1, further comprising means for applying a word-line voltage to said word-line and/or a bit-line voltage to said bit-line and
control means for controlling said word-line voltage so as to define three static states of a memory cell.

3. The memory array of claim 2,
wherein said control means are adapted for defining
    a pull state by controlling said word-line voltage to be larger than a ground voltage and to be smaller than a difference of a storage voltage provided at the gate of said storage transistor and a threshold voltage of said transistors,
    a store state by controlling said word-line voltage to be larger than a difference of said storage voltage and said threshold voltage and to be smaller than a sum of said storage voltage and said threshold voltage, and
    a write state by controlling said word-line voltage to be larger than a sum of said storage voltage and said threshold voltage and to be smaller than a supply voltage.

4. The memory array of claim 3,
wherein said control means are adapted for controlling said word-line voltage so as to define dynamic operations, in particular a read and a write operation, as transitions between two static states, wherein
    a read operation is defined as a transition between said store state and said pull state, and
    a write operation is defined as a transition between said store state and said write state.

5. The memory array of claim 4,
wherein said control means are adapted to decrease said word-line voltage from a store-level to a read-level to carry out a read operation and to increase said word-line voltage from a store-level to a write-level to carry out a write operation.

6. The memory array of claim 1,
wherein low-leakage MOS transistors are used as storage transistor and control transistor.

7. The memory array of claim 1,
wherein NMOST or PMOST memory cells are used.

8. The memory array of claim 1,
wherein each memory cell comprises further comprises a capacitance coupled between the gate of said storage transistor and ground.

9. A memory cell comprising:
a first transistor, coupled to receive data from a source and to a first command line, that stores the data on a gate of the first transistor;
a second transistor, coupled to the first transistor and a second command line, that controls the read and write function of the first transistor; and
wherein the memory cell does not contain more than two transistors.

10. The memory cell of claim 9 wherein the data is stored within momentary capacitance on the gate of the first transistor.

11. The memory cell of claim 9 wherein the first command line sets a mode for the first transistor.

12. The memory cell of claim 9 wherein the second command line provides enable and disable commands.

* * * * *